(12) United States Patent
Matsumura

(10) Patent No.: US 6,205,028 B1
(45) Date of Patent: *Mar. 20, 2001

(54) CIRCUIT SUBSTRATE INCLUDING PRINTED CIRCUIT BOARD HAVING HEAT-SHIELDING PORTION

(75) Inventor: Hiroshi Matsumura, Kitakatsuragi-gun (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/119,528

(22) Filed: Jul. 21, 1998

(30) Foreign Application Priority Data

Jul. 23, 1997 (JP) ............................................ 9-197028

(51) Int. Cl.⁷ ...................................................... H05K 7/20
(52) U.S. Cl. ........................................... 361/720; 174/252
(58) Field of Search ............................... 174/252; 361/707, 361/712, 713, 719–721, 816

(56) References Cited

U.S. PATENT DOCUMENTS

| 4,535,385 | 8/1985 | August et al. . |
| 4,628,407 | 12/1986 | August et al. . |
| 5,305,186 | 4/1994 | Appelt et al. . |
| 5,451,720 | * 9/1995 | Estes et al. ........................ 174/252 |

FOREIGN PATENT DOCUMENTS 5-52079   8/1993   (JP) .

OTHER PUBLICATIONS

Hill et al, Thermal Isolation Techique for Heat–Sensitive Components on A Printed Circuit Card, IBM Tech Disl. Bulletin, vol.20 No.9. 361/720 Feb. 1978.*

* cited by examiner

*Primary Examiner*—Gregory Thompson
(74) *Attorney, Agent, or Firm*—Nixon & Vanderhye P.C.

(57) ABSTRACT

A circuit substrate includes a plurality of electronic devices including a heat-generating electronic device, and a printed circuit board having the plurality of electronic devices mounted thereon and having a slit hole for thermally isolating a portion for mounting the heat-generating electronic device and a portion for mounting other electronic devices.

13 Claims, 14 Drawing Sheets

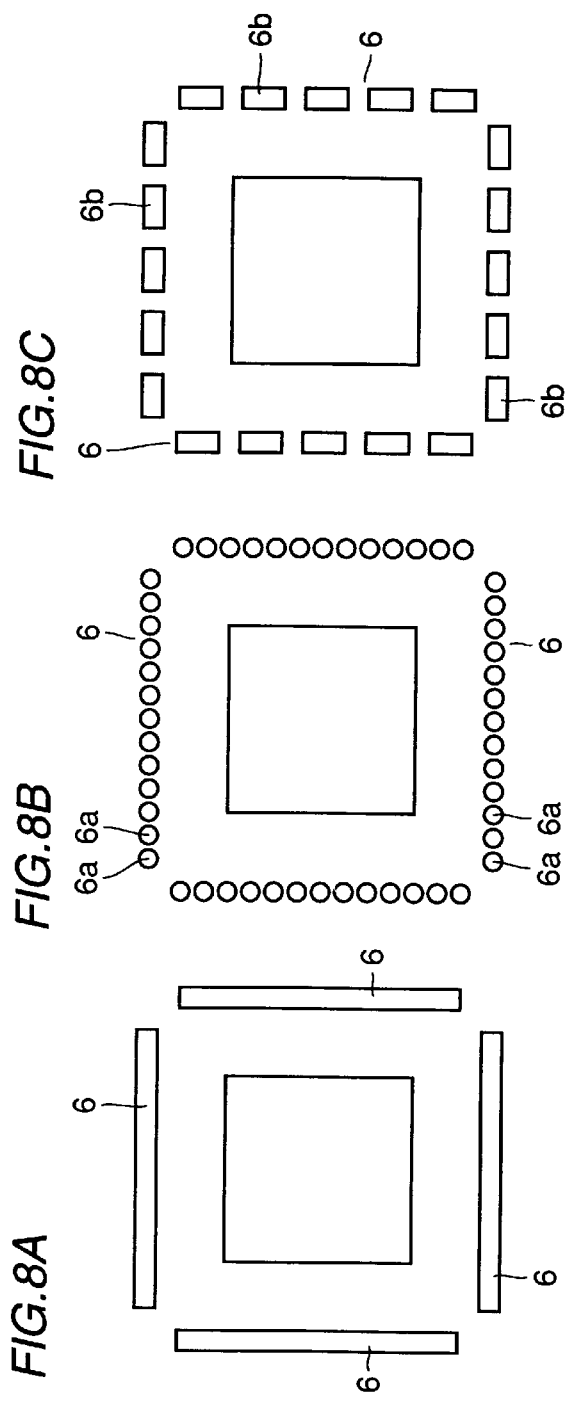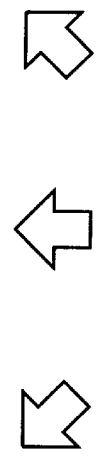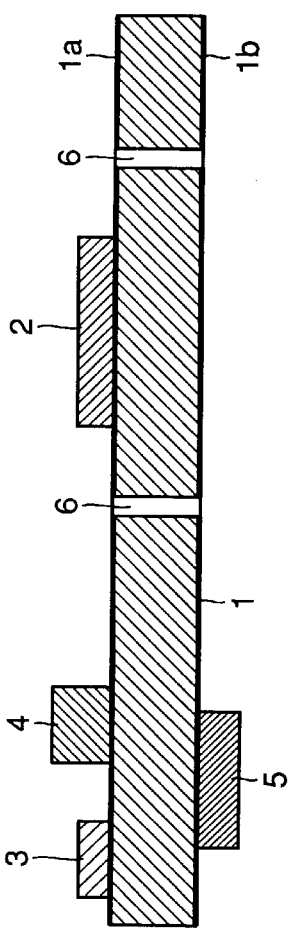

Y-DIRECTION

X-DIRECTION

CIRCUIT SUBSTRATE INCLUDING PRINTED CIRCUIT BOARD HAVING HEAT-SHIELDING PORTION

BACKGROUND OF THE INVENTION

1. Field of the Invention

The present invention relates generally to circuit substrates having a printed circuit board on which electronic devices generating much heat and requiring cooling (hereinafter referred to as heat-generating electronic devices) are mounted, and more particularly, to a circuit substrate which permits the influence of heat from the heat-generating devices upon the entire printed circuit board and other peripheral electronic devices by localizing the conduction of the heat to the mounted area of the electronic devices or to a particular direction, thereby restricting the conduction of heat in the direction along the surface of the printed circuit board.

2. Description of the Background Art

Devices such as CPUs installed in electronics such as work station and personal computer generate significant heat. Thus, the process of radiating heat from such a heat-generating electronic device is indispensable in order to provide satisfactory operation specs.

In conventional devices, in order to radiate heat generated from a heat-generating electronic device installed on a top surface layer of a printed circuit board, there are provided a number of through holes at the printed circuit board, and the through holes are plated. Then, the heat-generating electronic device and the through holes are connected. Further by connecting the through holes at the back surface layer of the printed circuit board to a heat radiation plate, heat generated from the electronic device is allowed to escape onto the heat radiation plate through the printed circuit board via these through holes.

In the conventional structure, however, a significant amount of heat is still transmitted from the heat-generating electronic device to the printed circuit board, the heat is transmitted in the vertical direction from the top surface layer to the back surface layer of the circuit board, in other words in the thickwise direction of the substrate, but part of the heat is also diffused in the crosswise direction of the printed circuit board, in other words in the direction along the surface, and the heat generated from the mounted portion of the printed circuit board adversely affects other peripheral electronic devices. Furthermore, the temperature of solder generally used as means for connecting electronic devices is raised at soldered parts of the printed circuit board by the conduction of heat, which could adversely affect the entire circuit substrate and is likely to cause operation faults or shorten the useful life of the circuit substrate.

FIGS. 1A and 1B are a plan view and a cross sectional view, respectively of a circuit substrate in a first conventional example disclosed by Japanese Patent Publication No. 5-52079. The circuit substrate shown in FIGS. 1A and 1B is incorporated into a personal computer or the like, and an electronic device generating much heat (heat-generating electronic device) 22 is provided on a printed circuit board 21.

Printed circuit board 21 includes a top surface layer 21a, a bottom surface layer 21b, a pair of inner layers 21c provided between top and bottom surface layers 21a and 21b and serving as a signal layer having signal lines for a particular circuit, and a ground plane layer 21d provided between the pair of inner layers 21c. There is provided at the top surface layer 21a or bottom surface layer 21b of printed circuit board 21, a die attaching pad 23 serving as a mounting portion electrically and physically insulating within circuit board 21.

Note that a denotes the die area.

Heat-generating electronic device 22 takes the form of TCP (Tape Carry Package), and the central portion of heat generation (die) 24 is secured to the die area a of die attaching pad 23 on the top surface layer 21a of the printed circuit board by a thermally conductive adhesive, a die attaching adhesive 25. Printed circuit board 21 having heat-generating electronic device 22 mounted thereon has its back surface side connected to a heat radiation plate 27 through solder or a thermal compound 26.

Thus, in the first conventional example, one or more plated through holes 28 are provided at printed circuit board 21, heat from heat-generating electronic device 22 is transmitted onto the back surface layer 21b of printed circuit board 21 through through holes 28, and the heat is further transmitted to heat-radiation plate 27.

FIGS. 2A and 2B are a plan view and a cross sectional view, respectively of a circuit substrate in a second conventional example disclosed by Japanese Patent Publication No. 5-52079. In the second conventional example, one or more relatively large, un-plated through holes 29 are provided at printed circuit board 21.

Through hole 29 is formed larger than die area a, and a fitting portion 27a extended as a projection from heat-radiation plate 27 is fitted therein. Heat-generating electronic device 22 is directly connected to a surface of radiation plate fitting portion 27a exposed from through hole 29 using die attaching adhesive 25. As a result, heat from heat-generating electronic device 22 may be directly transmitted to radiation plate 27 without being passed through printed circuit board 21.

FIG. 3 shows a third conventional example, in which only heat-generating electronic device 22 is separately provided at a dedicated printed circuit board 21, so that heat generated from heat-generating electronic device 22 will not be transmitted to other peripheral electronic devices 30, 31 and 32. These other peripheral electronic devices 30, 31 and 32 are mounted on a printed circuit board 21a which is separately prepared, and a stacking connector 33 or the like is provided to connect these printed circuit boards 21 and 21a.

The first to third conventional examples are encountered with the following problems. In the third conventional example, printed circuit board 21 dedicated to heat-generating electronic device 22 should be provided separately from printed circuit board 21a for other peripheral electronic devices, which is disadvantageous in terms of cost for materials as well as in terms of mounting efficiency and electrical characteristics as compared to the case of mounting heat-generating electronic device 22 and other devices together at a single printed circuit board 21.

In contrast, the first conventional example is advantageous in terms of the efficiency, because heat generated from electronic device 22 is transmitted from the top surface layer 21a of printed circuit board 21 to bottom surface layer 21b, and then onto heat-radiation plate 27. However, since the heat conduction is through a number of through holes 28 provided with plated layers at printed circuit board 21, and therefore the part of printed circuit board 21 having through holes 28 is exposed to high heat from heat-generating electronic device 22.

As a result, as heat diffuses onto the entire surface of printed circuit board 21, the temperature of printed circuit board 21 is raised, and thermal stress imposed on the other peripheral electronic devices or the soldered portion cannot be avoided.

In the second conventional example, heat radiation plate fitting portion 27a is engaged into one or more relatively large un-plated through holes 29 provided at printed circuit board 21, and therefore fitting portion 27a and heat-generating electronic device 22 are directly connected. Thus, heat conduction is allowed without transmitting heat from heat-generating electronic device 22 to printed circuit board 21. However, die attaching adhesive 25, a generally heat conductive adhesive, is used as means for connecting the surfaces of heat-generating electronic device 22 and heat radiation plate 27, and therefore die attaching adhesive 25 should be removed and re-adhesion is necessary during disassembling and replacement working for repairing or the like.

Since the adhesion process by die attaching adhesive 25 requires a heat curing process, and therefore after heat-generating electronic device 22 is again attached by applying die attaching adhesive 25, a heat-curing process should be once again performed.

When heat is radiated through printed circuit board 21, in general heat radiation structures including the above conventional examples, heat from heat-generating electronic device 22 is diffused into the periphery of printed circuit board 21 or printed circuit board 21 is shielded against heat. Therefore, the direction of heat conduction and diffusion onto printed circuit board 21 cannot be specified.

As described above, the first and second conventional examples both suffer from the problems, and to achieve optimum heat radiation for printed circuit board 21, it is inevitable to transmit heat from heat-generating electronic device 2 to the side of bottom surface layer 21b through a number of plated through-holes, shield printed circuit board 21 against heat conduction and diffusion, whereby to avoid transmission of heat onto other electronic devices 30, 31, and 32 mounted on printed circuit board 21 and the soldered portions.

SUMMARY OF THE INVENTION

It is an object of the present invention to provide a circuit substrate that permits the effect of heat from an electronic device generating much heat upon other electronic devices to be reduced.

According to one aspect of the invention, the circuit substrate includes a plurality of electronic devices including a heat-generating electronic device, and a printed circuit board having a plurality of electronic devices mounted thereon and a shielding portion which thermally isolates the portion for mounting the heat-generating electronic device and the portion for mounting the other electronic devices.

The printed circuit board has the heat-shielding portion for thermally isolating the portion for the heat-generating electronic device from the other electronic devices, and therefore heat diffusion through the printed circuit board may be prevented, so that the effect of the heat onto the other electronic devices may be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A to 8C are plan views showing various variations of slit holes isolating the heat-generating electronic device mounting portion and the peripheral portion on the printed circuit board;

FIG. 8D is a common cross sectional view of FIGS. 8A to 8C;

DESCRIPTION OF THE PREFERRED EMBODIMENTS

Figure 1A:
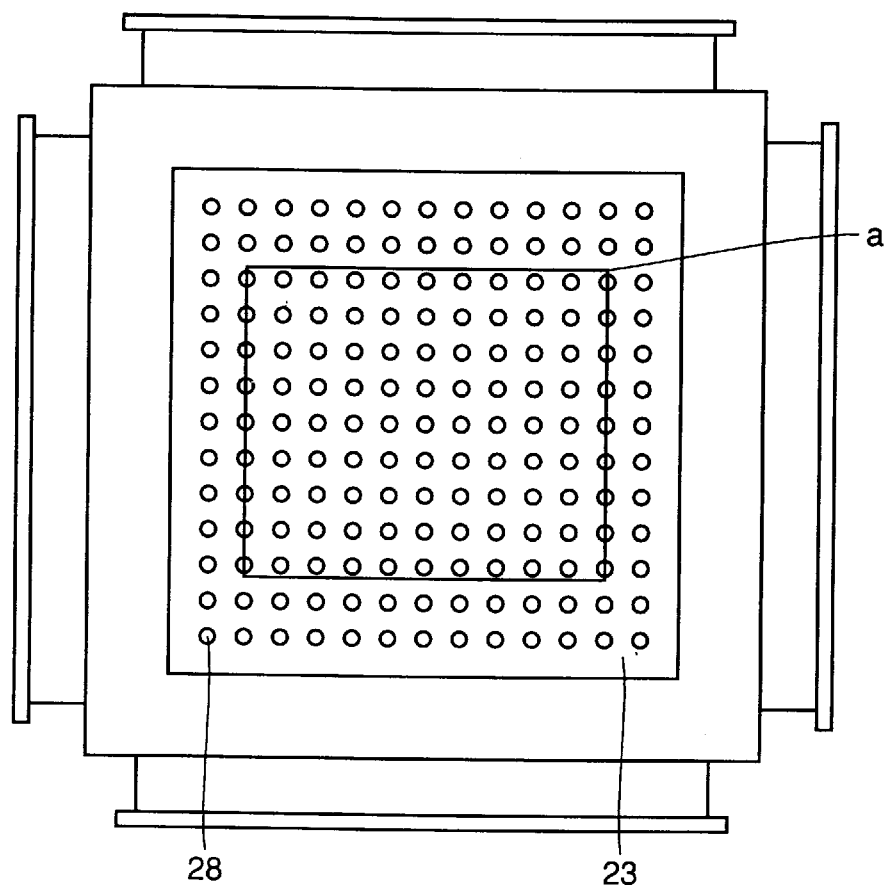
FIGS. 1A and 1B are a plan view and a cross sectional view, respectively of a circuit substrate in a first conventional example.
Figure 1B:
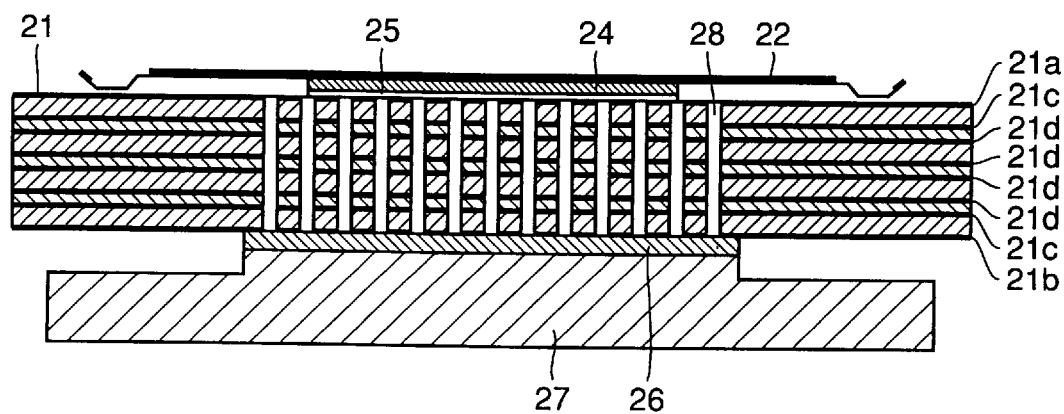
Figure 2A:
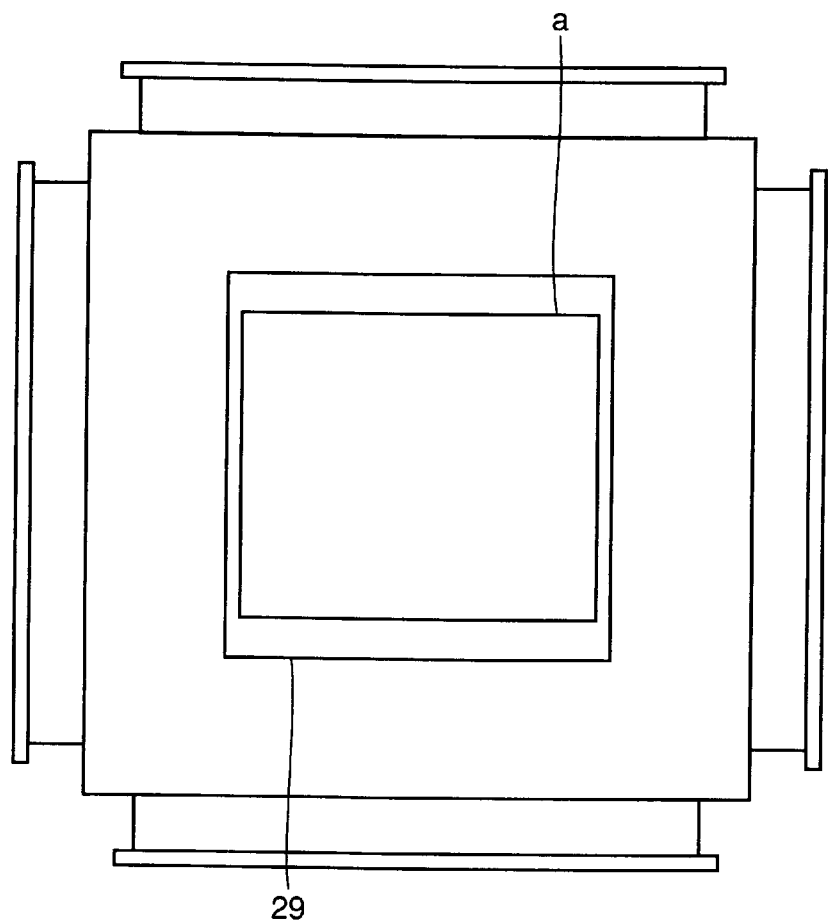
FIGS. 2A and 2B are a plan view and a cross sectional view, respectively of a circuit substrate in a second conventional example.
Figure 2B:
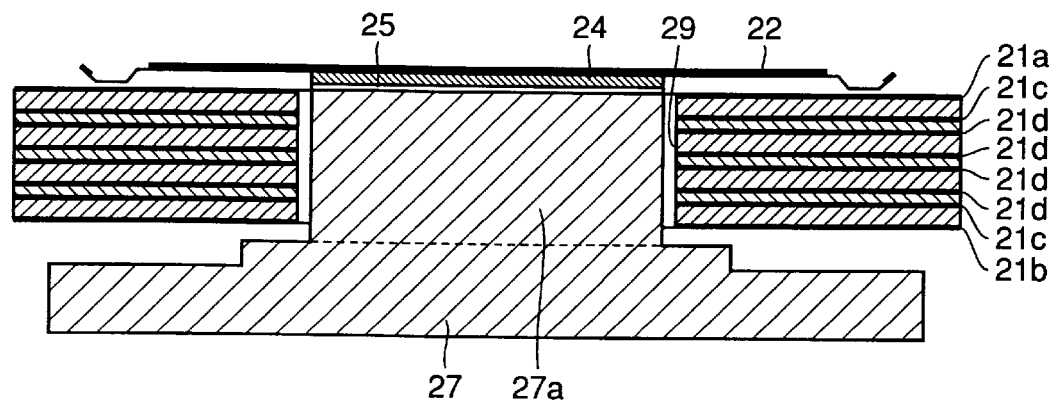
Figure 3:
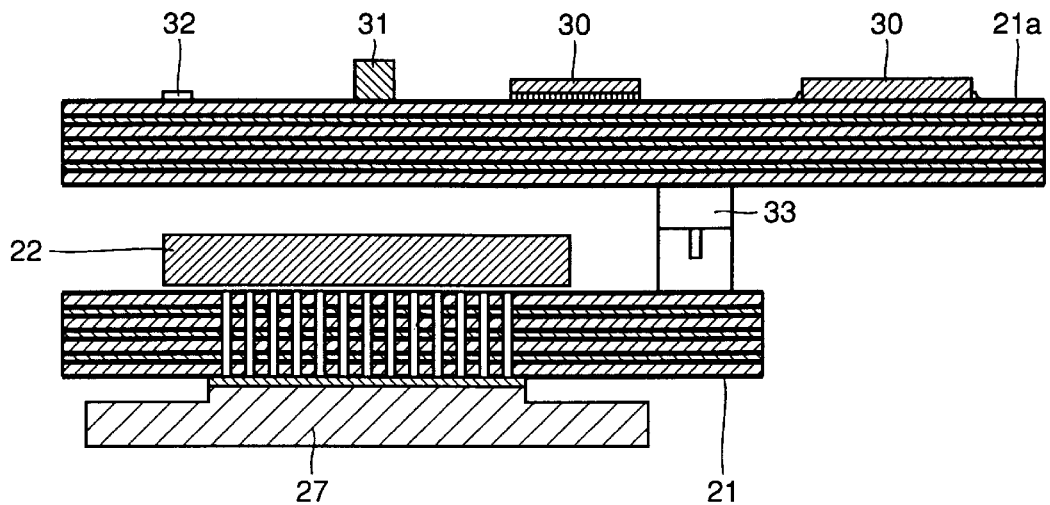
FIG. 3 is a cross sectional view of a circuit substrate in a third conventional example.
Figure 4A:
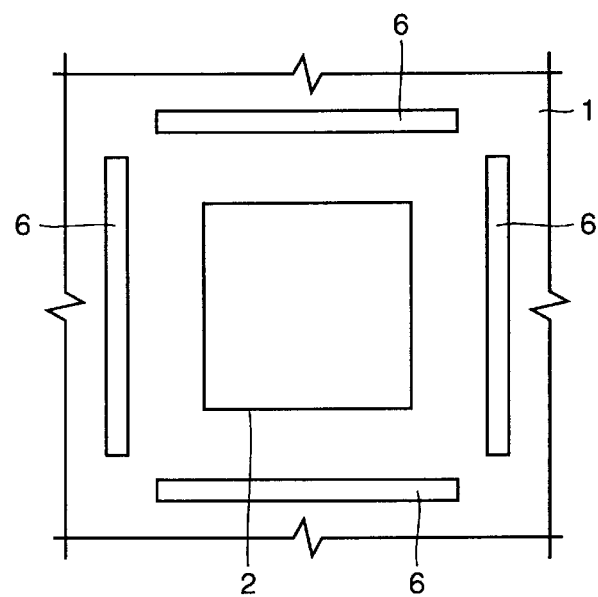
FIGS. 4A and 4B are a plan view and a cross sectional view, respectively of a circuit substrate, according to a first embodiment of the invention.
Figure 4B:
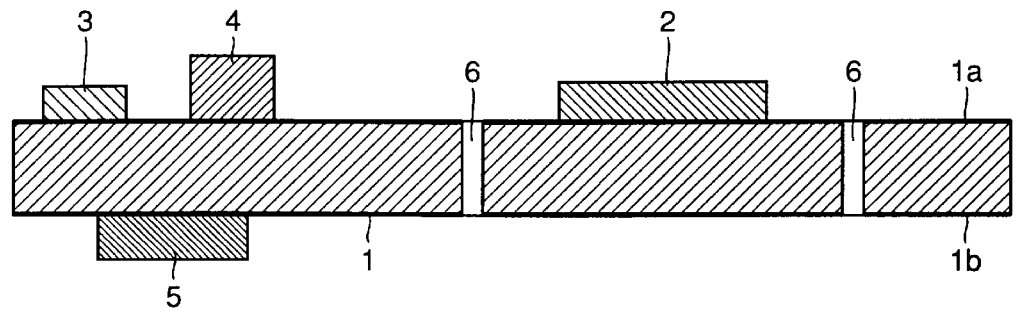

Embodiments of the present invention will be now described in conjunction with the accompanying drawings. A circuit substrate shown in FIGS. 4A and 4B is incorporated in a personal computer or the like, and a heat-generating electronic device 2 generating much heat and electronic devices 3 and 4 generating normal amounts of heat which does not thermally affect other devices are installed on a top surface layer 1a of printed circuit board 1. Electronic device 5 generating a normal amount of heat is also installed on a back surface layer 1b. In the following description, these electronic devices 3, 4 and 5 generating a normal amount of heat will be referred to as peripheral electronic devices. In the embodiments, the electrical connection between these electronic devices 2 to 5 and printed circuit board 1 is performed by generally used solder.

In this embodiment, from the periphery of heat-generating electronic device 2, in other words from the four sides of electronic device 2, un-plated elongated slit holes 6 penetrating printed-circuit board 1 in the thickness wise direction are provided at a prescribed intervals.

The presence of these slit holes 6 partially isolate printed circuit board 1, and therefore heat transmitted to peripheral electronic devices 3, 4 and 5, and to solder for connection is shielded against, so that heat generated from heat-generating electronic device 2 may be restricted from diffusing to the periphery through printed circuit board 1 as much as possible. As a result, the reliability of the circuit substrate is improved. Note that the shape of slit hole 6 may be circular or angular other than the shown elongate shape.

Second Embodiment

Figure 5A:
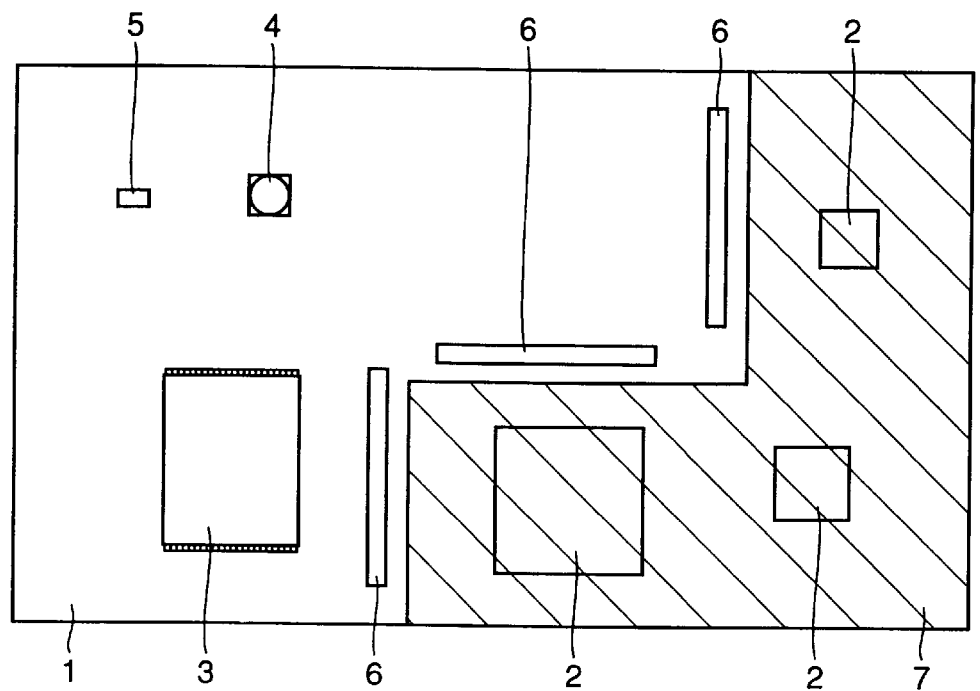
FIGS. 5A and 5B are a plan view and a cross sectional view, respectively of a circuit substrate according to a second embodiment of the invention.
Figure 5B:
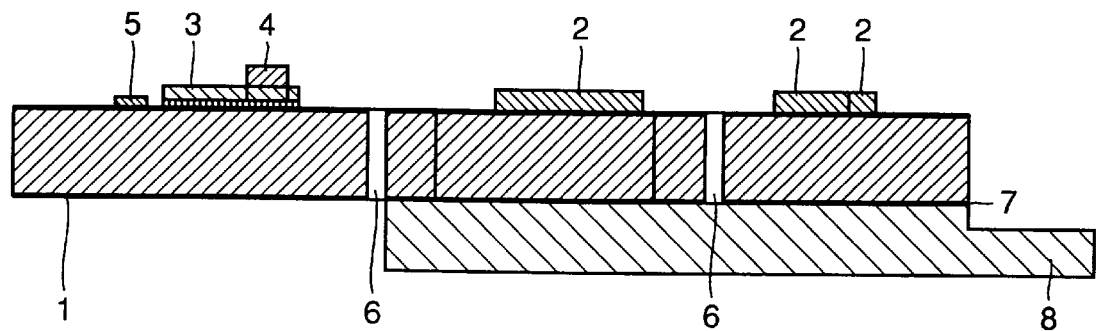

In this embodiment, portions having the same structure and function as those according to the first embodiment shown in FIGS. 4A and 4B are denoted with the same reference characters. Referring to FIGS. 5A and 5B, the circuit substrate has a heat-shielding portion formed by elongate slit holes 6 as is the case with the first embodiment. These slit holes 6 are however formed only on a portion in the particular direction rather than in all the four directions in the periphery of the heat-generating electronic device mounting portion.

More specifically, in this embodiment, a plurality of heat-generating electronic devices 2, and peripheral electronic devices 3, 4 and 5 are provided collectively in separate regions at a printed circuit board 1, and slit holes 6 are formed at three positions to separate these regions. A bottom surface layer 1b along the region on printed circuit board 1 including the mounting portion for heat-generating electronic device 2 is connected to a heat radiation plate 8 through a thermal sheet 7 shown in shadowed in FIG. 5A.

Thus, heat generated from the plurality of heat-generating electronic devices 2 are prevented from being transmitted or diffused onto a low temperature portion at printed circuit board 1 by the function of slit holes 6. Then, heat is conducted and radiated onto heat radiation plate 8 through thermal sheet 7 from the portion whose temperature is raised by the heat generated from heat-generating electronic device 2. Thus, the heat conduction and the heat shielding become direction-oriented as described above, and portion which may be transmitted with heat and a portion which should not be transmitted with heat may be separated, leading to efficient heat radiation.

If the central portion of heat generation (die) and the OLB (Outer Lead Bonding) of a heat-generating electronic device requiring cooling are separated from each other as in the case of TCP (Tape Carry Package) or BGA-P (Ball Grid Array Package), the present invention would be significantly effective. Such embodiments will be specifically described.

Third Embodiment

Figure 6A:
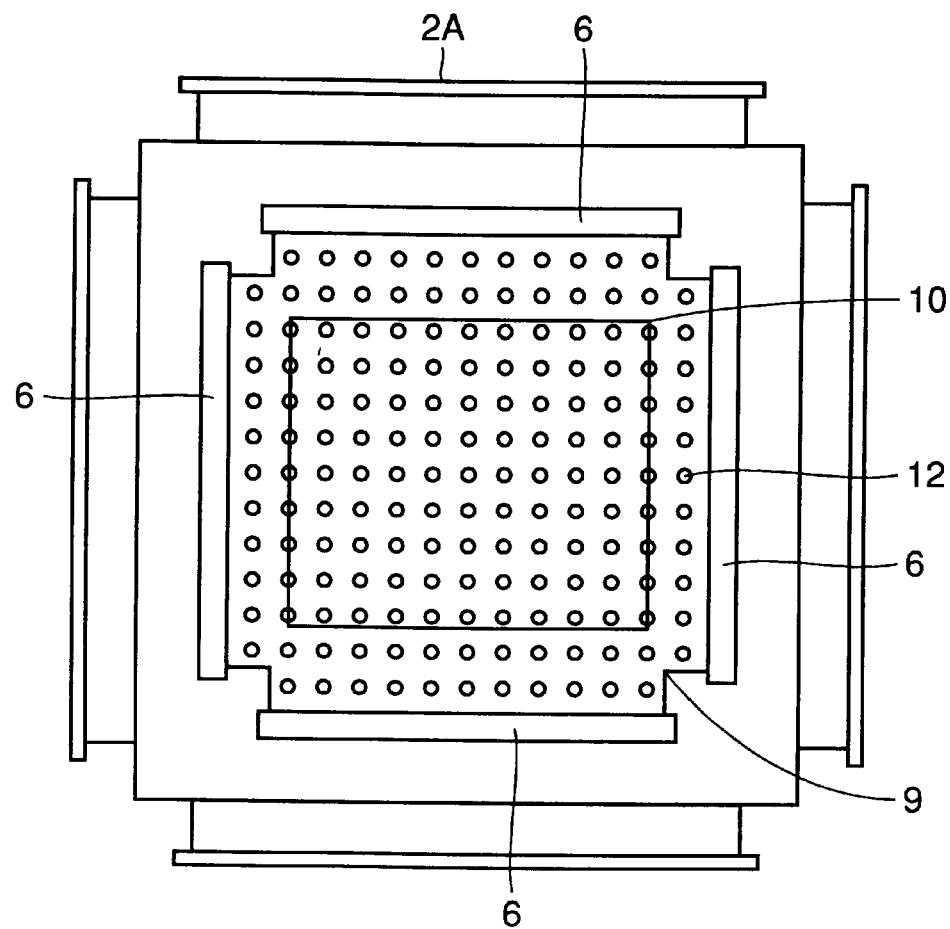
FIGS. 6A and 6B are a plan view and a cross sectional view, respectively of a circuit substrate according to a third embodiment of the invention.
Figure 6B:
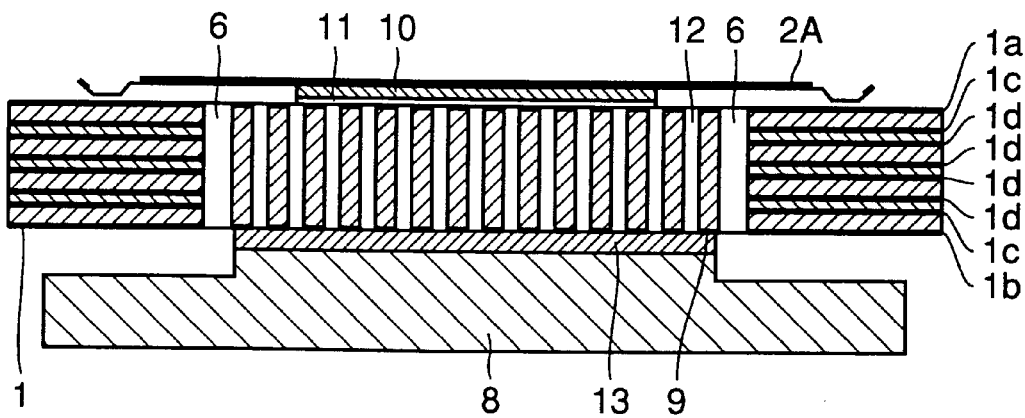

In this embodiment, portions having the same structure and function as those according to the first and second embodiments described above are denoted with the same reference characters. Referring to FIGS. 6A and 6B, the circuit substrate has a heat shielding portion formed by elongate slit holes 6 as is the case with the first embodiment. Printed circuit board 1 includes a top surface layer 1a, a bottom surface layer 1b, a pair of inner layers 1c provided between top and bottom surface layers 1a and 1b and serving as a signal layer having signal lines for particular circuits, and a ground plane layer 1d provided between the pair of inner layers 1c.

In this embodiment, the heat-generating electronic device takes the form of TCP 2A, the central portion of heat generation from TCP 2A, in other words die 10 is connected to a die attaching pad 9 as an electrically and physically insulating mounting portion provided at the top surface layer 1a of printed circuit board 1, using die attaching adhesive 11, a thermally conductive adhesive. Another die attaching pad 9 is provided at the bottom surface layer 1b of printed circuit board 1, and the heat of top die attaching pad 9 is transmitted to bottom die attaching pad 9 through a number of plated through holes 12. A heat radiation plate 8 is connected to back surface layer 1b by solder, a thermal compound 13 or the like.

In the heat radiation structure of TCP 2A described above, heat generated from the die 10 of TCP 2A is conducted to printed circuit board 1 through die attaching adhesive 11 from die attaching pad 9 on the top surface layer side, further conducted to die attaching pad 9 on the back surface layer side through those through holes 12, and then radiated onto radiation plate 8 from back surface layer 1b.

In the radiation path, heat from TCP 2A is also conducted and diffused in the direction along the surface of printed circuit board 1 by die attaching pad 9 and those plated through holes 12. However, since un-plated elongate slit holes 6 are formed in the periphery of the die 10 of TCP 2A, the mounting area for the TCP on printed circuit board 1 is separated from the other region, TCP 2A is thermally shielded from the periphery of printed circuit board 1, and heat conduction or diffusion toward the direction along the surface is significantly restricted.

Fourth Embodiment

Figure 7A:
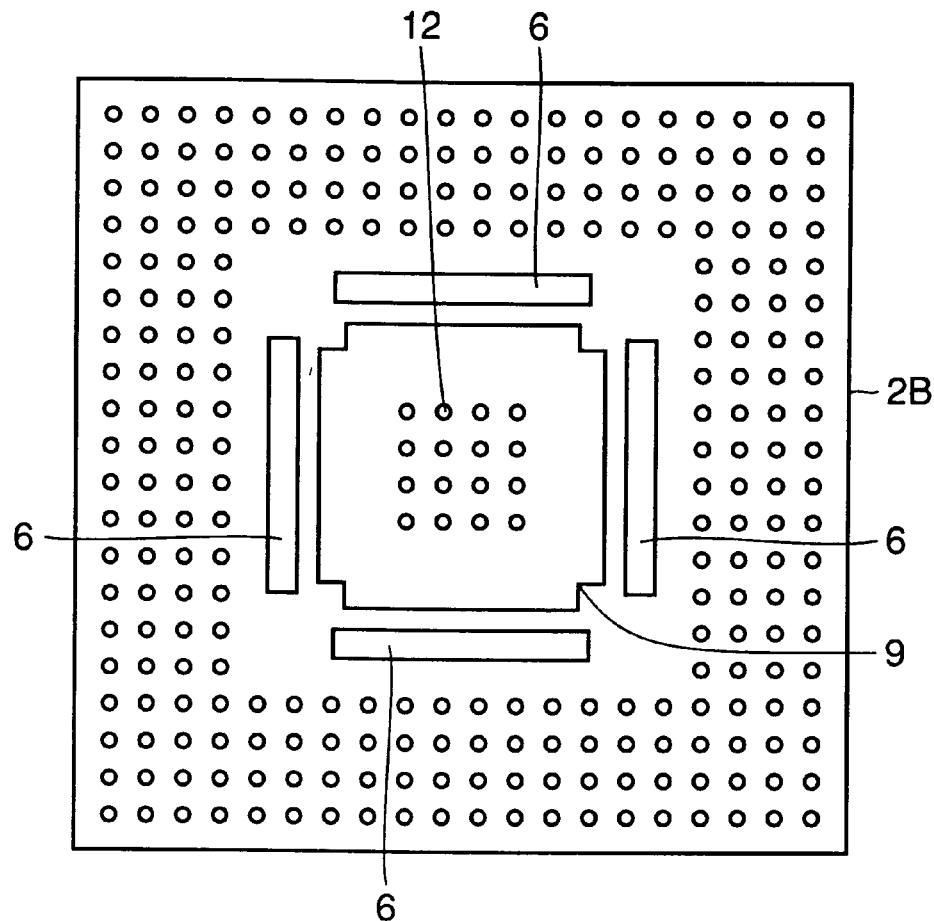
FIGS. 7A and 7B are a plan view and a cross sectional view, respectively of a circuit substrate according to a fourth embodiment of the invention.
Figure 7B:
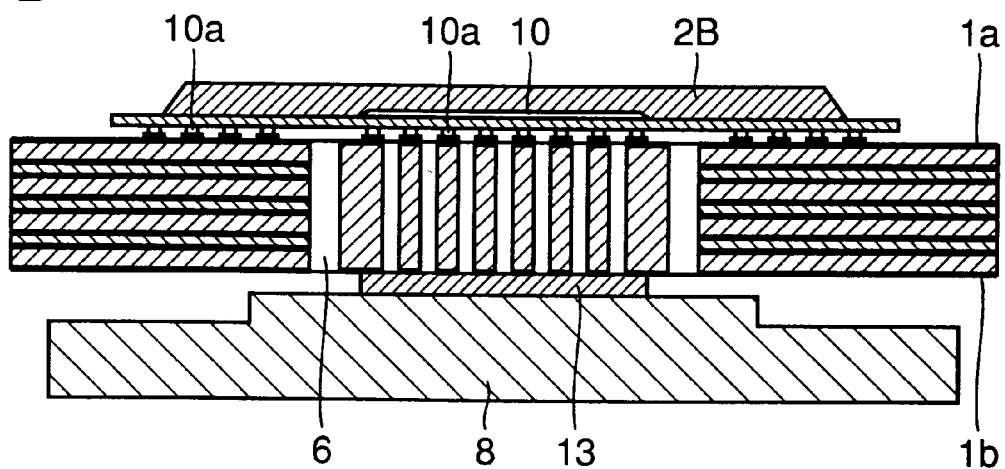

In this embodiment, portions having the same structure and function as those according to the first to third embodiments described above are denoted with the same reference characters. Referring to FIGS. 7A and 7B, the circuit substrate has a heat-shielding portion formed by elongate slit holes 6 as is the case with the first embodiment. Printed circuit board 1 includes a top surface layer 1a, a bottom surface layer 1b and two inner layers 1c.

In this embodiment, a heat-generating electronic device takes the form of BGA-P 2B, the die 10 of which is connected to a die attaching pad 9 provided at the top surface layer 1a of printed circuit board 1 by solder balls 10a provided at die 10. Another such die attaching pad 9 is provided at the bottom surface layer 1b of printed circuit board 1, and heat is conducted through a number of plated through holes 12 at top and back die attaching pads 9. A heat radiation plate 8 is connected to back surface layer 1b by solder or a thermal compound 13.

In the heat generation structure of the PGA-P 2B, heat generated from the die 10 of the PGA-P 2B is conducted to printed circuit board 1 through solder ball 10a from die attaching pad 9 on the top surface layer side, further conducted to die attaching pad 9 on the back surface layer side through those through holes 12, and radiated onto radiation plate 8 from back surface layer 1b.

In the radiation path, heat from the PGA-P 2B is conducted and diffused in the direction along the surface of printed circuit board 1 by die attaching pad 9 and those plated through holes 12. However, since un-plated elongate slit holes 6 are formed in the periphery of the die 10 of the BGA-P 2B, the mounting region for the BGA-P at printed circuit board 1 is isolated from the other region, and the BGA-P 2B is thermally shielded from the periphery of printed circuit board 1, so that heat conduction and diffusion in the direction along the surface is significantly restricted.

As is the case with the third and fourth embodiments, un-plated slit holes 6 are formed between the central portion of heat generation from heat-generating electronic device 2 installed on printed circuit board 1 and the peripheral portion including the external connection terminal portion of heat-generating electronic device 2, and heat from the central portion of heat generation from heat-generating electronic device 2 may be restricted from being conducted and diffused onto the periphery, so that the amount of heat conduction can be restricted as much as possible.

In general, slit hole 6 is preferably formed into an elongate shape as large as possible, in order to isolate heat-generating electronic device 2 and the area in the periphery on printed circuit board 1. However, printed circuit board 1 should secure minimum strength necessary for holding at least die 10, i.e., the central body of heat generation from heat-generating electronic device 2.

As a result, a slit formed by arranging a series of small diameter holes 6a as shown in FIG. 8B may be employed for the shape of slit hole 6, other than the elongate hole shown in FIG. 8A. As shown in FIG. 8C, the strength and heat shielding characteristic of printed circuit board 1 may be simultaneously secured by arranging a plurality of square holes 6b in series in a slit form. Those slit holes 6 should be one or more at the surface in the direction to shield heat against, depending upon the strength of printed circuit board 1 and the amount of heat desired to be shielded against. Note that FIG. 8D is a cross sectional view showing any of slit holes 6 shown in FIGS. 8A to 8C provided on printed circuit board 1 according to the first embodiment.

By forming at least one un-plated slit hole at the periphery of or at one side of heat-generating electronic device 2 on printed circuit board 1, the path for physically conducting heat may be reduced so that the amount of conducted heat is reduced as well.

Figure 9A:
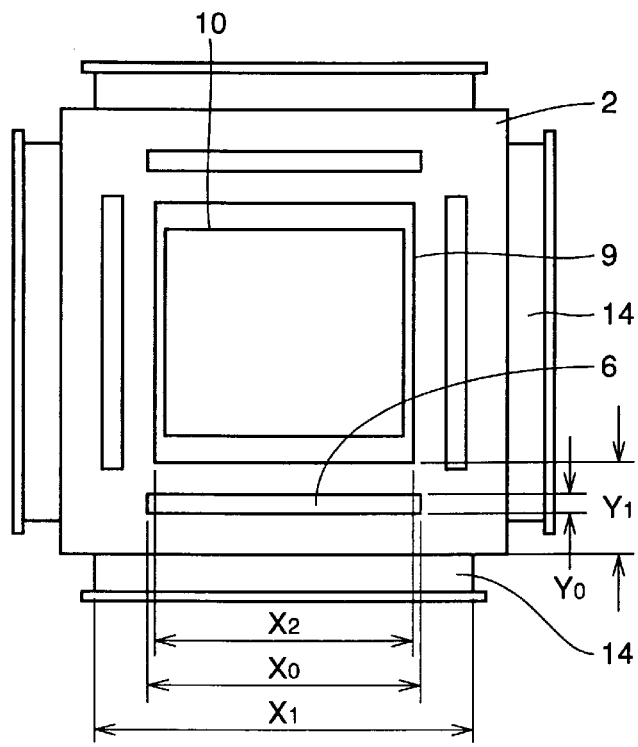
FIGS. 9A and 9B are a plan view and a cross sectional view, respectively for use in illustration of the optimum size of a slit hole in the heat-generating electronic device according to the third or fourth embodiment.
Figure 9B:
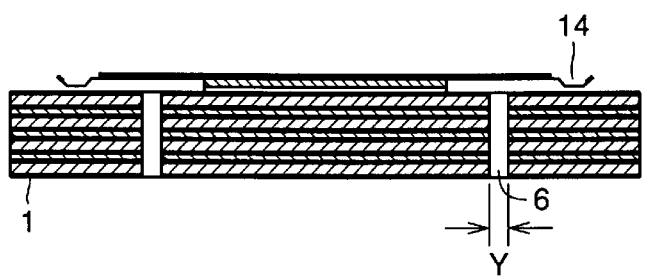

FIGS. 9A to 9D show optimum sizes of slit holes when the die 10 of heat-generating electronic device and OLB interconnection land 14 are separated from each other as in the TCP described in connection with the third embodiment or in the BGA-P described in connection with the fourth embodiment. As shown in FIGS. 9A and 9B, the length $X_0$ of slit hole 6 formed in the periphery of the die 10 of the TCP or BGA-P or in a particular direction is set smaller than the length $X_1$ of the OLB interconnection plate land 14 of heat-generating electronic device 2. Length $X_0$ is set larger than the length $X_2$ of die attaching pad 9 for the die 10 of heat-generating electronic device 2.

Figure 9C:
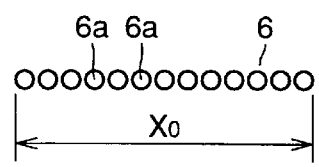
FIGS. 9C and 9D are views showing the sizes of the slit holes corresponding to FIGS. 8B and 8C.
Figure 9D:
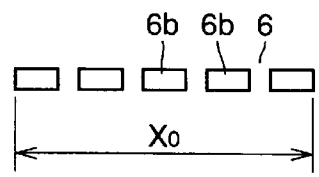

Note that the length $X_0$ of slit hole 6 represents the maximum size in the lengthwise direction if only one such slit is provided on one side of heat-generating electronic device 2. If a number of holes are provided on one side of heat-generating electronic device 2, length $X_0$ represents the maximum distance between both ends of holes 6. FIG. 9C shows a length $X_0$ of slit hole 6 formed of a group of circles shown in FIG. 8B. FIG. 9D shows the length $X_0$ of slit hole formed of a group of square holes shown in FIG. 8C.

The size $Y_0$ in the widthwise direction of slit hole 6 is set within the distance $Y_1$ between the OLB interconnection plate land 14 of heat-generating electronic device 2 and die attaching pad 9 for the die 10 of heat-generating electronic device 2, irrespectively of those slit holes 6 provided.

Thus, by appropriately setting the size and the number of slit holes 6, highly effective heat shielding may be implemented, while securing the interconnection space for the printed circuit board.

Fifth Embodiment

Figure 10A:
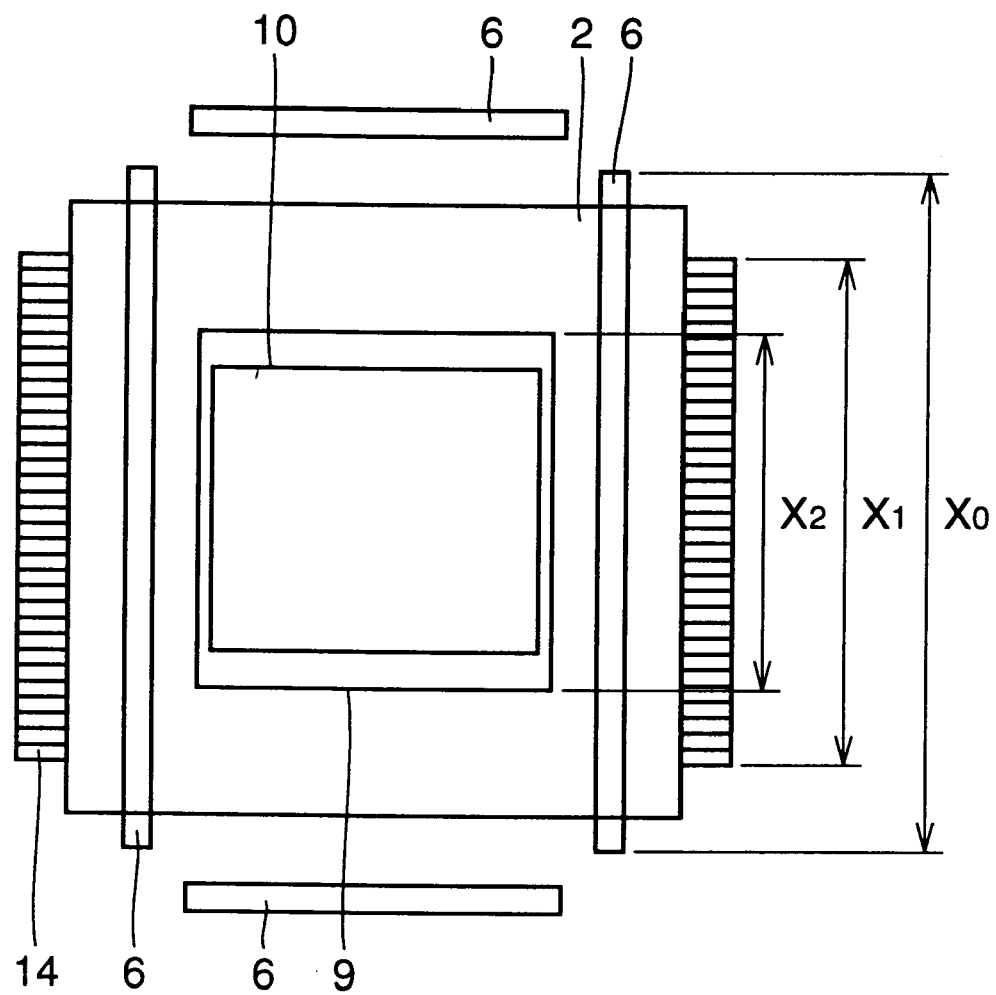
FIGS. 10A and 10B are a plan view and a cross sectional view, respectively of a circuit substrate according to a fifth embodiment of the invention.
Figure 10B:
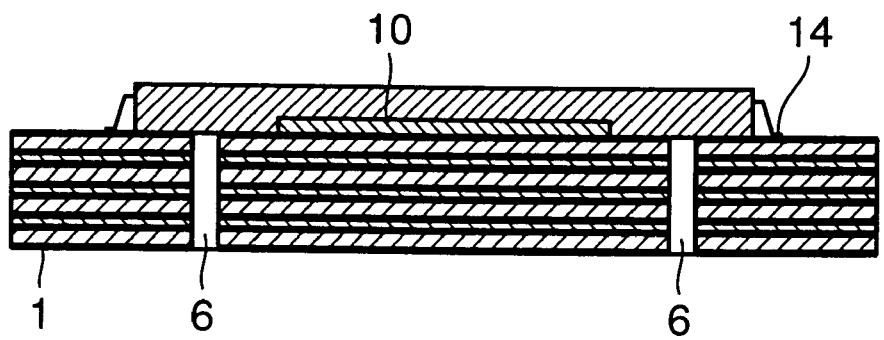

FIG. 10A is a plan view of a circuit substrate according to a fifth embodiment of the invention, and FIG. 10B is a cross sectional view thereof. In this embodiment, portions having the same structure and function as those according to the first to fourth embodiments are denoted by the same reference characters, and the description is not repeated. This embodiment relates to part of a package of a heat-generating electronic device having connection terminal portions in two directions rather than in four directions such SOJ (Small Outline J lead), SOP (Small Outline Package) or LOC, CSP or TCP. In any of the cases, as shown in FIG. 10A, the lengthwise size $X_0$ of slit hole 6 could be larger than the size $X_1$ of OLB interconnection plate land 14.

Sixth Embodiment

Figure 11A:
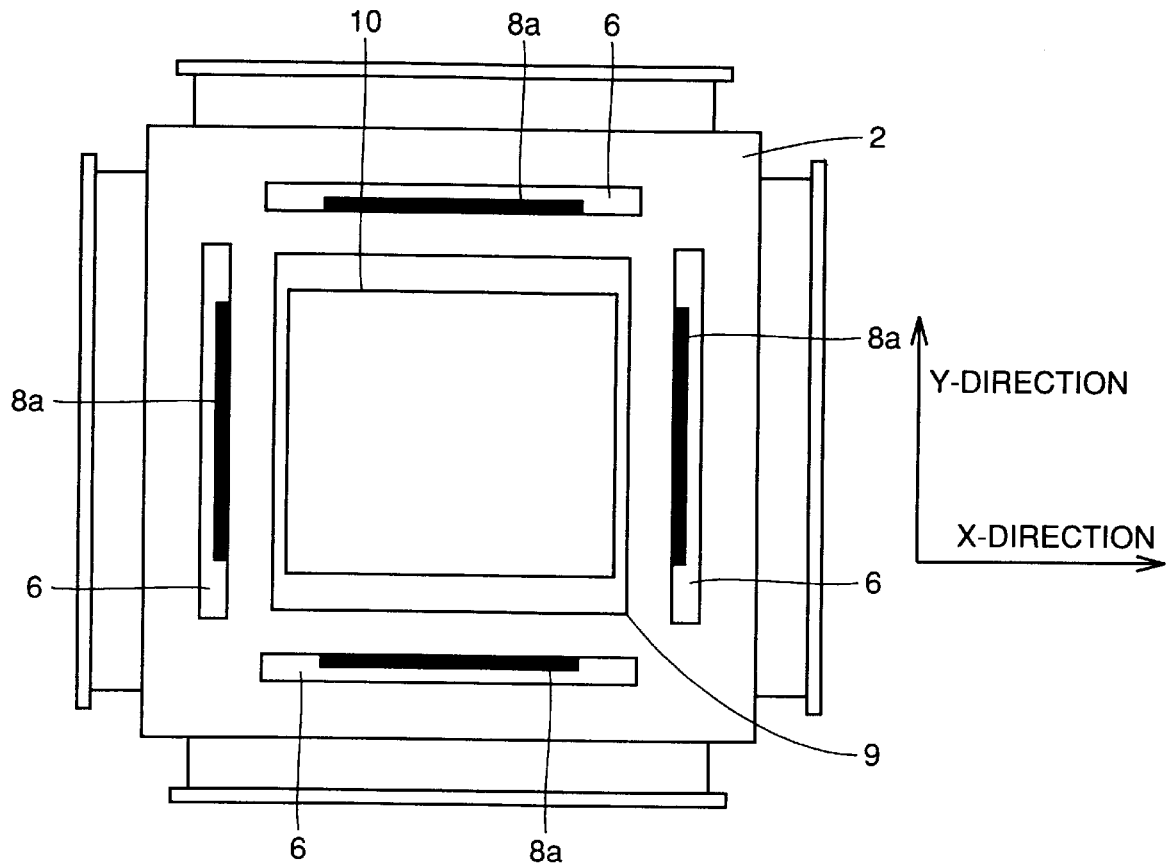
FIGS. 11A and 11B are a plan view and a cross sectional view, respectively of a circuit substrate according to a sixth embodiment of the invention.
Figure 11B:
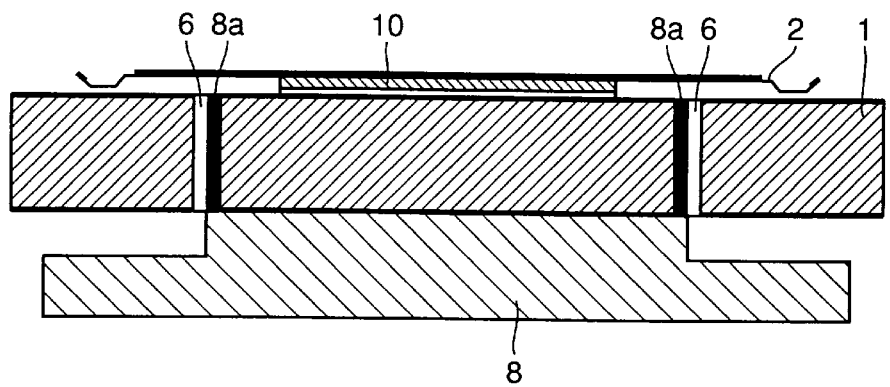
Figure 12:
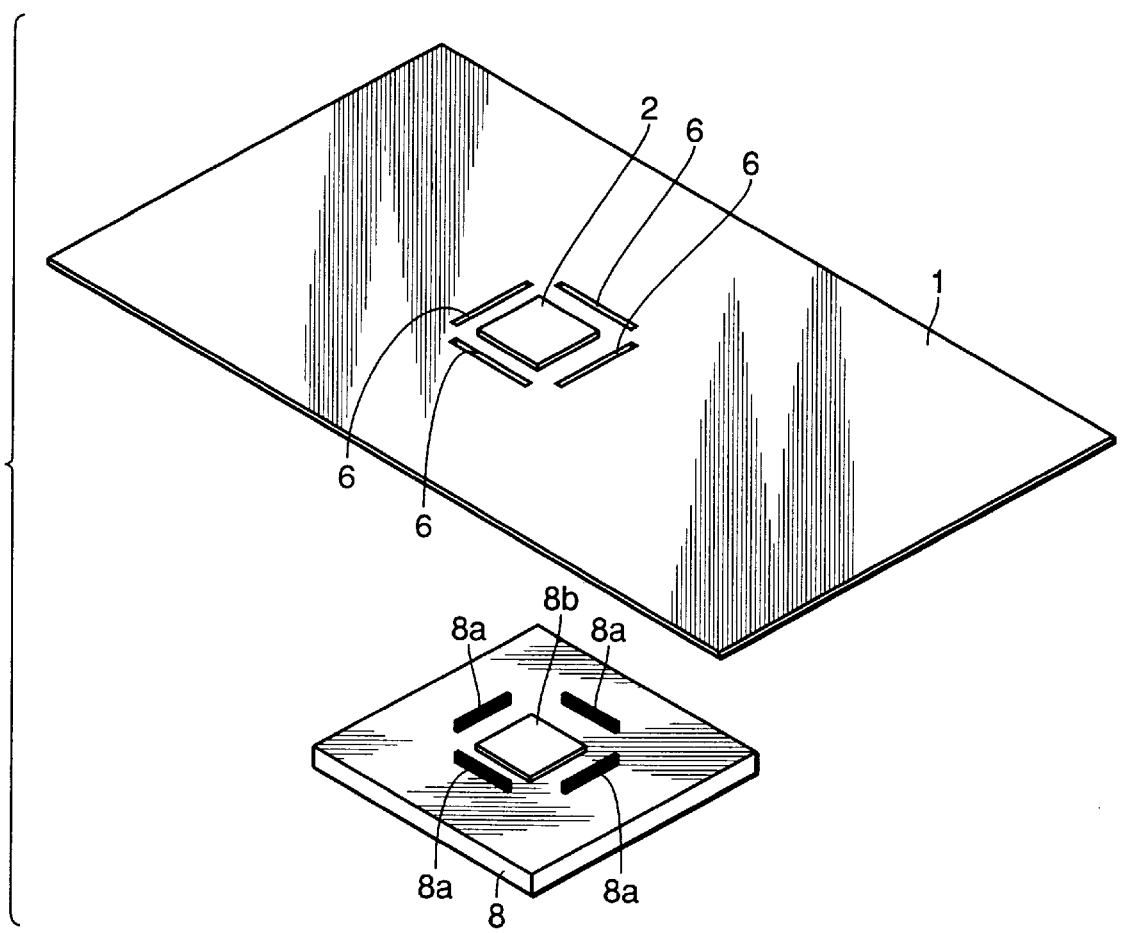
FIG. 12 is an exploded perspective view showing the printed circuit board and radiation plate shown in FIGS. 11A and 11B.

FIG. 11A is a plan view of a circuit substrate according to a sixth embodiment of the invention, and FIG. 11B is a cross sectional view thereof. FIG. 12 shows the positional relation between a printed circuit board 1 and a radiation plate 8. Note that in this embodiment, the portions having the same structure and function as those in the first to fifth embodiments are denoted by the same reference characters, and the description is not repeated. In this embodiment, un-plated slit holes 6 are formed in the four directions around heat-generating electronic device 2, and an extension piece 8a which can be inserted into each slit hole 6 is formed integrally with radiation plate 8. Before attaching radiation plate 8 to printed circuit board 1, each extension piece 8a is inserted into slit hole 6, so that the attaching position in the X-direction and Y-direction may be automatically determined. Note that radiation plate 8 is provided with a heat absorbing portion 8b which receives heat from printed circuit board 1.

Seventh Embodiment

Figure 13A:
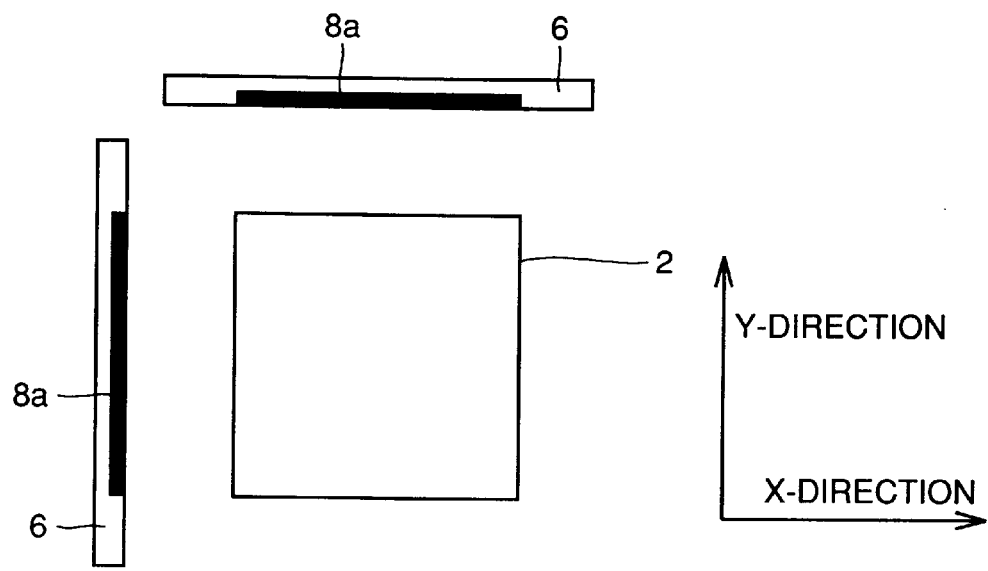
FIGS. 13A and 13B are a plan view and a cross sectional view, respectively of a circuit substrate according to a seventh embodiment of the invention.
Figure 13B:
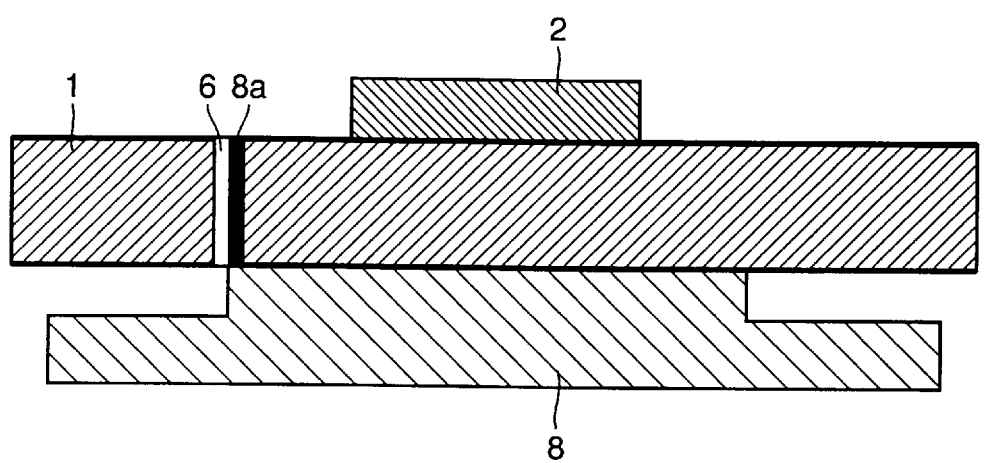

FIG. 13A is a plan view of a circuit substrate according to a seventh embodiment of the invention, and FIG. 13B is a cross sectional view thereof. Note that in this embodiment, portions having the same structure and function as those in the first to sixth embodiments are denoted by the same reference characters, and the description is not repeated. In this embodiment, un-plated slit holes 6 are formed in two directions around heat-generating electronic device 2 and in an L shape (orthogonal to each other), and an extension pieces 8a which can be each inserted into each slit hole 6 is formed integrally with heat radiation plate 8. At the time of attaching irradiation plate 8 to printed circuit board 1, each extension piece 8a is inserted into slit hole 6, so that the attaching position in the X-direction and Y-direction may be automatically determined. As a result, a jig or mechanism for attaching the radiation plate is not necessary, which improves the assembling efficiency.

Eighth Embodiment

Figure 14A:
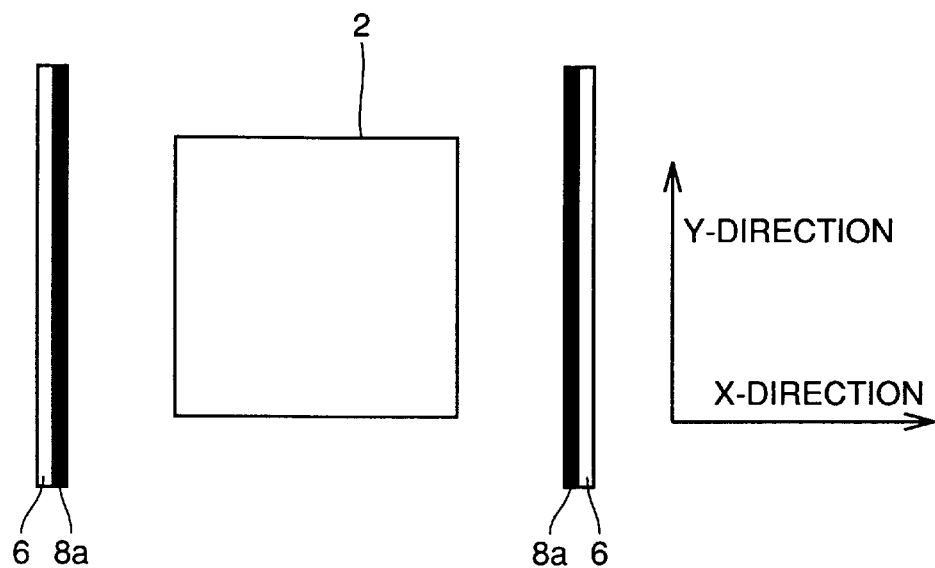
FIGS. 14A and 14B are a plan view and a cross sectional view, respectively of a circuit substrate according to an eighth embodiment of the invention.
Figure 14B:
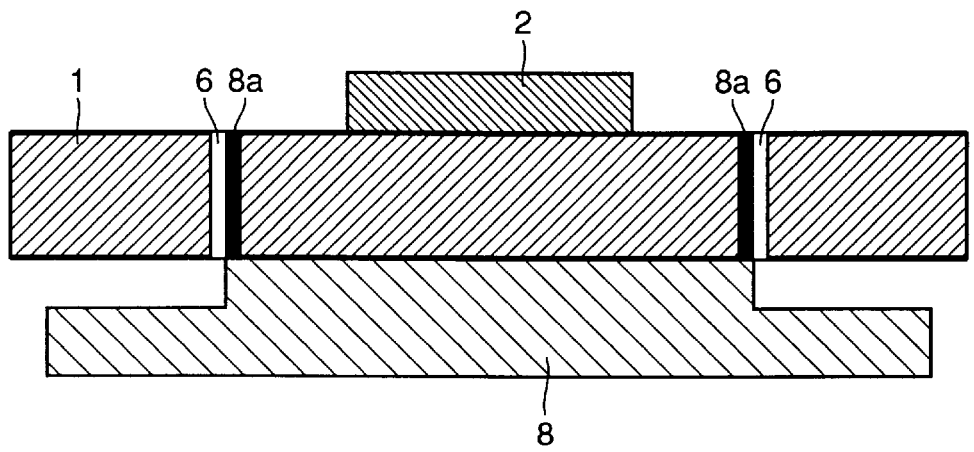

FIG. 14A is a plan view of a circuit substrate according to an eighth embodiment of the invention, and FIG. 14B is a cross sectional view thereof. Note that in this embodiment, the portions having the same structure and function as those in the first to seventh embodiments are denoted by the same reference characters, and the description is not repeated. In this embodiment, un-plated slit holes 6 are provided on two parallel opposing sides of heat-generating electronic device 2.

In this embodiment, an extension piece having a shape which can be inserted into each slit hole 6 provided at radiation plate 8 is adapted to the shape of un-plated slit hole 6, so that the attaching position in the X-direction is determined, but radiation plate 8 could be shifted in the Y-direction. As a result, by adapting the length of extension piece 8a of radiation plate 8 to the length of slit hole 6, the translation in the Y-direction may be prevented, so that position of attaching radiation plate 8 is determined.

In the circuit substrates according to the sixth to eighth embodiments, the tip end of extension piece 8a of radiation plate 8 extended for the purpose of positioning may be folded into a hooked shape, or extension piece 8a may be formed into a shape which can be press into slit hole 6, so that radiation plate 8 can be secured at printed circuit board 1.

FIGS. 15A to 15I show various forms of such extension piece 8a for securing radiation plate 8 to the slit hole 6 of printed circuit board 1. Note that radiation plate 8 is shown shadowed. In FIGS. 15A to 15E, radiation plate 8 is secured by forming the tip end portion 15 of extension piece 8a of radiation plate 8 into a hooked shape so that it will not be detached from slit hole 6.

Figure 15A:
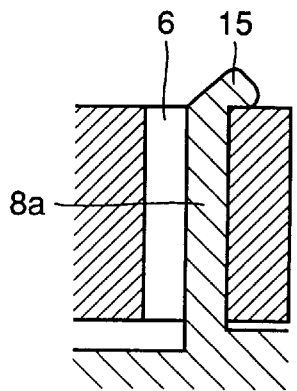
FIGS. 15A to 15I are cross sectional views showing main parts of various forms of an extension piece for securing a radiation plate to a slit hole at a printed circuit board.
Figure 15B:
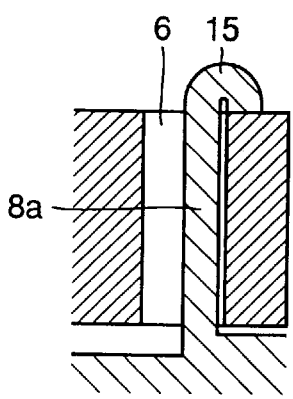
Figure 15C:
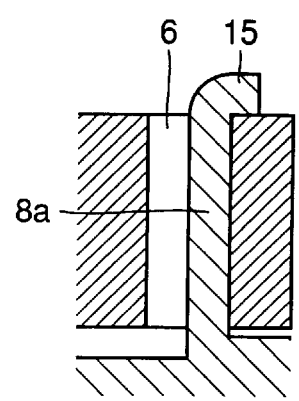
Figure 15D:
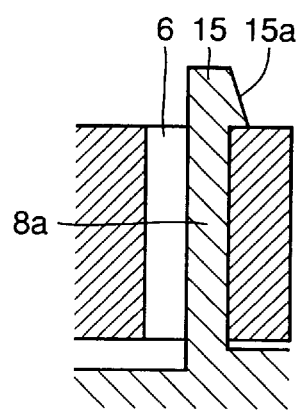
Figure 15E:
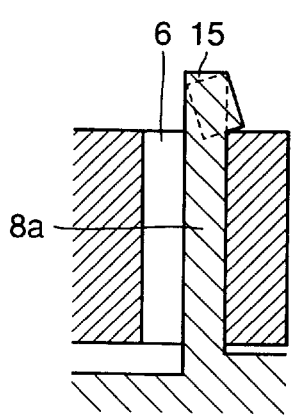

FIG. 15A shows tip end portion 15 in a cornerless hooked shape, FIG. 15B in a hooked shape to press the upper surface of printed circuit board 1, FIG. 15C in a normal hooked shape, FIG. 15D shows tip end portion 15 in a hooked shape provided with an inclined sliding surface 15a to aid the deformation of extension piece 8a when engaged into a slit, and FIG. 15E shows the tip end in diagonal abutment upon the opening portion of slit hole 6.

Figure 15F:
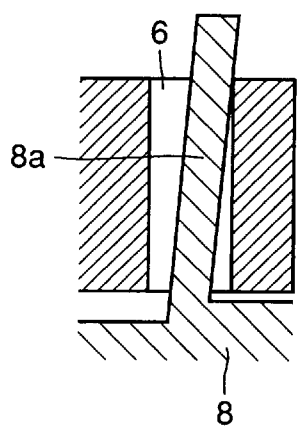
Figure 15G:
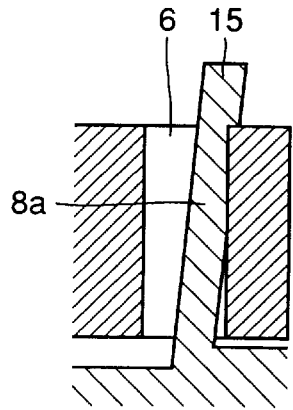
Figure 15H:
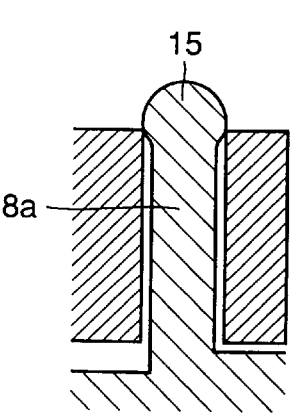
Figure 15I:
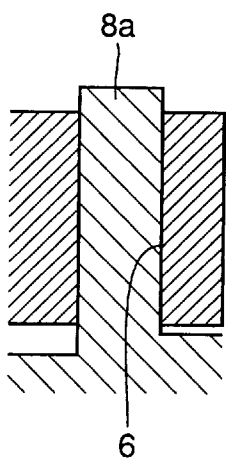

In FIGS. 15F and 15G, the extension piece 8a of radiation plate 8 is prevented from coming off by the pressure of a spring. In FIG. 15F, extension piece 8a is formed into an inclined shape, and in FIG. 15G, extension piece 8a has an inclined shape and tip end portion 15 is formed into a hooked shape. Furthermore, the extension piece 8a of radiation plate 8 or tip end portion 15 are formed to be pressed in to prevent coming off, in order to secure radiation plate 8. In FIG. 15H, tip end portion 15 is formed into a cylindrical shape having a diameter slightly larger than the width of slit hole 6, and in FIG. 15I, the entire extension piece 8a is pressed into slit hole 6 in a shrink fit manner.

By the structures shown in FIGS. 15A to 15I, radiation plate 8 may be secured by simply being attached to printed circuit board 1, in other words a mechanical structure or mechanical part for securing are not necessary, which reduces the cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit device, comprising:

a plurality of electronic devices including a heat-generating electronic device; and a printed circuit board having said plurality of electronic devices mounted thereon, wherein a plurality of unplated holes penetrating through said printed circuit board are provided at a periphery of said heat-generating electronic device thereby defining a heat-shield on said printed circuit board between a first portion where said heat-generating electronic device is mounted and a second portion where other of said electronic devices are mounted, and further wherein said heat-shield inhibits conduction of heat from said first portion to said second portion of said printed circuit board.

2. The circuit device as recited in claim 1, wherein said plurality of unplated holes include at least one elongated hole.

3. The circuit device as defined in claim 1, wherein said plurality of unplated holes are elongated holes.

4. The circuit device of claim 2, wherein said elongated hole extends in a direction that is generally parallel to a side of said heat-generating electronic device.

5. The circuit device of claim 3, wherein each of said elongated holes extends in a direction that is generally parallel to a respective side of said heat-generating electronic device.

6. The circuit device of claim 2, further comprising a die attaching pad in contact with said heat-generating electronic device and said printed circuit board, said heat-generating electronic device being shaped such that a die of said heat-generating electronic device is apart from an outer lead bonding at least by the width of said elongated hole, the length of said elongated hole being smaller than the length of a land for said outer lead bonding at said printed circuit board and larger than the length of said die attaching pad, the width of said elongated hole being at most the distance between said land for said outer lead bonding and said die attaching pad.

7. A circuit device, comprising:

a plurality of electronic devices including a heat-generating electronic device;

a printed circuit board having said plurality of electronic devices mounted thereon, wherein at least one unplated hole penetrating through said printed circuit board is provided at a periphery of a die of said heat-generating electronic device, thereby defining a heat-shield on said printed circuit board between a first portion where said heat-generating electronic device is mounted and a second portion where other of said electronic devices are mounted, and further wherein said heat-shield inhibits conduction of heat from said first portion to said second portion of said printed circuit board;

a plurality of through holes in the second portion where said heat-generating electronic device is mounted;

a heat radiation plate;

a first die attaching pad provided at a top surface layer of said printed circuit board and in contact with said plurality of through holes and connected to said heat-generating electronic device; and a second die attaching pad provided at a bottom surface layer of said printed circuit board and in contact with said plurality of through holes, and connected to said heat radiation plate.

8. The circuit device as recited in claim 7, wherein said at least one unplated hole includes at least one elongated hole.

9. The circuit device as defined in claim 7, wherein said device includes a plurality of said unplated holes and said unplated holes are elongated holes.

10. The circuit device of claim 8, wherein said elongated hole extends in a direction that is generally parallel to a side of said heat-generating electronic device.

11. The circuit device of claim 9, wherein each of said elongated holes extends in a direction that is generally parallel to a respective side of said heat-generating electronic device.

12. A circuit substrate comprising:

a plurality of electronic devices including a heat-generating electronic device;

a printed circuit board having said plurality of electronic devices mounted thereon and having a heat-shielding portion for thermally isolating a portion for mounting said heat-generation electronic device and a portion for mounting other electronic devices, a heat radiation plate; and an extension piece provided in said heat-shielding portion and in contact with said heat-shielding portion and said heat radiation plate.

13. The circuit substrate as recited in claim 12, wherein said extension piece is formed integrally with said heat-radiation plate.

* * * * *